United States Patent [19]

Gough

[11] Patent Number: 5,442,216

[45] Date of Patent: Aug. 15, 1995

[54] SEMICONDUCTOR DEVICE HAVING ACTIVE DEVICE CELLS AND A MONITOR CELL

[75] Inventor: Paul A. Gough, Smallfield, England

[73] Assignee: U.S. Philips Corporation, New York, N.Y.

[21] Appl. No.: 242,687

[22] Filed: May 13, 1994

Related U.S. Application Data

[63] Continuation of Ser. No. 42,966, Apr. 5, 1993, abandoned.

[30] Foreign Application Priority Data

Apr. 9, 1992 [GB] United Kingdom ............... 9207849

[51] Int. Cl.⁶ ........................................... H01L 29/78
[52] U.S. Cl. .................................. 257/355; 257/401; 257/341; 257/139
[58] Field of Search ............... 257/139, 140, 341, 401, 257/127, 336, 154, 355, 48

[56] References Cited

U.S. PATENT DOCUMENTS

| | | | |
|---|---|---|---|
| 3,352,915 | 10/1994 | Hutchings et al. | 257/335 |
| 4,136,354 | 1/1979 | Dobkin | 257/470 |
| 4,553,084 | 11/1985 | Wrathall | 323/316 |
| 4,783,690 | 11/1988 | Walden et al. | 257/140 |
| 4,893,158 | 1/1990 | Mihara et al. | 257/341 |
| 4,908,682 | 3/1990 | Takahashi | 257/336 |
| 4,931,844 | 6/1990 | Zommer | 257/288 |
| 4,962,411 | 10/1990 | Tokura et al. | 257/336 |
| 4,980,740 | 12/1990 | Pattanayak et al. | 257/152 |
| 4,994,904 | 2/1991 | Nakagawa et al. | 257/336 |
| 5,034,796 | 7/1991 | Zommer | 257/467 |
| 5,097,302 | 3/1992 | Fujihira et al. | 257/341 |
| 5,367,980 | 11/1994 | Gough | 257/355 |

*Primary Examiner*—Robert P. Limanek
*Assistant Examiner*—David B. Hardy
*Attorney, Agent, or Firm*—Steven R. Biren

[57] ABSTRACT

A semiconductor body (2) has a first region (3) providing a current path to a first main electrode (4) and carrying a plurality of active device cells (5). The majority (5a) of the active device cells are connected to a second main electrode (6) for providing a main current path through the device between the first and second main electrodes (4 and 6). At least one remaining active device cell forms a monitor cell (5b) and is connected to a monitor electrode (7) for providing a monitor current path through the device between the first main electrode (4) and the monitor electrode (7). The one monitor cell (5b) is formed differently from the majority (5a) of the active device cells so as to be more susceptible to failure than the majority of the active device cells so providing an early warning of the imminent failure of the device enabling evasive action to be taken to inhibit failure of the entire device.

13 Claims, 4 Drawing Sheets

SEMICONDUCTOR DEVICE HAVING ACTIVE DEVICE CELLS AND A MONITOR CELL

This is a continuation of application Ser. No. 08/042,966, filed Apr. 5, 1993, now abandoned.

BACKGROUND OF THE INVENTION

This invention relates to a semiconductor device comprising a semiconductor body having a first region providing a current path to a first main electrode and carrying a plurality of active device cells, the majority of the active device cells being connected to a second main electrode for providing a main current path through the device between the first and second main electrode and at least one remaining active device cell forming a monitor cell and being connected to a monitor electrode for providing a monitor current path through the device between the first main electrode and the monitor electrode.

Such a device is proposed in U.S. Pat. No. 4,783,690 and has been described in various other publications, for example U.S. Pat. Nos. 4,553,084, 4,136,354 and 4,893,158.

As indicated in the above-mentioned publications, the current through the at least one monitor cell provides an indication of the current through the whole active device so enabling the current through the device to be monitored during its operation. Furthermore the current through the at least one monitor cell may be used to provide a signal to switch off the active device when the current sensed exceeds a critical limit. For example, where the active device is a power MOSFET or IGBT (Insulated Gate Bipolar Transistor) then the sensed current may be used to provide a signal to reduce the gate voltage to the active device as described in U.S. Pat. No. 4,893,158. When a critical level is reached such a circuit may be used to switch off the device when it reaches its safe operating area (SOA) limit. However, there is a danger that detection of such an overcurrent will occur only when the device is already beginning to fail and that therefore any remedial action, for example to reduce the gate voltage in the case of a power MOSFET or IGBT, in response to the sensed overcurrent will not happen soon enough to prevent failure of the device.

SUMMARY OF THE INVENTION

It is an aim of the present invention to provide a semiconductor device which enables an early warning to be provided of imminent device failure.

According to the present invention, there is provided a semiconductor device comprising a semiconductor body having a first region providing a current path to a first main electrode and carrying a plurality of active device cells, the majority of active device cells being connected to a second main electrode for providing a main current path through the device between the first and second main electrode and at least one remaining active device cell forming a monitor cell and being connected to a monitor electrode for providing a monitor current path through the device between the first main electrode and the monitor electrode, characterized in that the at least one monitor cell is formed differently from the majority of the active device cells so as to be more susceptible to failure than the majority of the active device cells.

In a device in accordance with the invention, the at least one monitor cell is more susceptible to failure than the remainder of the active device cells. Accordingly, if during operation the device approaches its safe operating area (SOA) limit the at least one monitor cell will already be beginning to fail, so providing a higher current than the remainder of the active cells and thus providing a signal that can be used to enable failure of the device to be prevented.

Means may be provided for comparing the currents along the main current path and the monitor current path to enable the onset of failure of the at least one monitor cell to be detected. This provides a relatively simple method of determining when the current through the device is beginning to approach unacceptable limits. The output of the comparing means may be used to control the drive voltage to the active device so as, for example, to switch the device on or off, depending upon the detected fault condition.

In another example, a monitor resistor may be provided in series with the monitor electrode and means, for example a transistor, responsive to the voltage across the monitor resistor may be provided for reducing the drive current to a control electrode of the active device when the current through the at least one monitor cell exceeds a given value. Such an arrangement may be more responsive in providing current limiting.

Each active device cell may comprise an insulated gate field effect device cell having an insulated gate overlying a conduction channel region between a second region and the first region, the second main electrode being connected to the second regions of the majority of the device cells and the monitor electrode being connected to the second region of the at least one monitor cell and an insulated gate electrode being connected to the insulated gates for controlling the conduction channel regions between the first and second regions, the at least one monitor cell being formed so as to be more susceptible to failure by parasitic bipolar action than the majority of the active device cells.

The first and second regions may be of the same conductivity type and each second region may be separated from the first region by a respective body region of the opposite conductivity type which defines with the insulated gate the conduction channel region between the first and second regions so forming a so-called DMOS type of insulated gate field effect device.

The body region of each of the majority of the active device cells may have a relatively highly doped subsidiary region for inhibiting parasitic bipolar action but the relatively highly doped subsidiary region may be omitted from the at least one monitor device cell so making the at least one monitor cell more susceptible to failure by parasitic bipolar action.

A predetermined surface area of the body region of each of the majority of the active device cells may be electrically shorted to its second region and a given surface area, smaller than the predetermined area, of the body region of the at least one monitor cell may be electrically shorted to its second region, thereby making the at least one monitor cell more susceptible to breakdown by parasitic bipolar action. The at least one monitor cell may be provided at the outermost periphery of the area occupied by the majority of the active device cells to enhance its sensitivity to early breakdown.

The at least one monitor cell may have a different geometry from the active device cells. For example, where the cells are insulated gate field effect device cells, the body region of the at least one monitor cell may have areas of a higher degree of curvature than the active device cells so making the at least one monitor cell more likely to breakdown.

The active device cells may define an active device area which is bounded by peripheral active device cells with each peripheral active device cell having an integral guard region for inhibiting breakdown of the peripheral active device cell. In such a case, the at least one monitor cell may be provided at the periphery of the active device area and without an integral guard region.

The active device cells may form a first regular array and a number of monitor cells may be provided which form a second regular array with the second regular array being separated from the first regular array by a distance greater than the separation of the active device cells in the first regular array. The monitor cells in the second regular array may be separated from one another by a distance greater than the separation of the active device cells in the first regular array.

The first region may form a pn junction with at least one further region of the opposite conductivity type for injecting minority carriers into the first region. Thus, in the case of an insulated gate device, an insulated gate bipolar transistor (IGBT) may be formed.

BRIEF DESCRIPTION OF THE DRAWINGS

Embodiments of the invention will now be described, by way of example, with reference to the accompanying drawings, in which.

It should of course be appreciated that FIGS. 1 to 7 and 10 to 11 are merely schematic and are not to scale, relative dimensions such as the thickness of layers having been exaggerated in the interests of clarity. Throughout the drawings similar parts are referenced by similar reference numerals.

DESCRIPTION OF THE PREFERRED EMBODIMENTS

Figure 1:
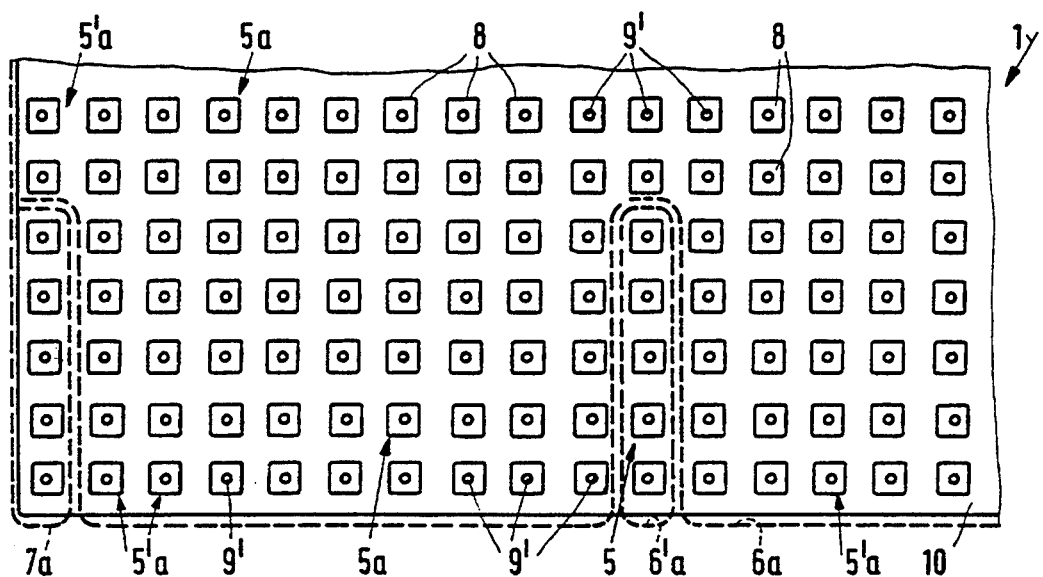
FIG. 1 is a schematic plan view of part of a semiconductor device in accordance with the invention.

Referring now to the drawings, a semiconductor device 1 comprises a semiconductor body 2 having a first region 3 providing a current path to a first main electrode 4 and carrying a plurality of active device cells 5, the majority 5a of active device cells being connected to a second main electrode 6 for providing a main current path through the device between the first and second main electrodes 4 and 6 and at least one remaining active device cell forming a monitor cell 5b and being connected to a monitor electrode 7 for providing a monitor current path through the device between the first main electrode 4 and the monitor electrode 7. In accordance with the invention, the at least one monitor cell 5b is formed differently from the majority 5a of the active device cells so as to be more susceptible to failure than the majority of the active device cells.

As the monitor cell 5b is made more susceptible to failure and will thus fail before the majority 5a of the active device cells, an early warning of the imminent failure of the device can be provided enabling evasive action to be taken to inhibit failure of the entire device 1.

Referring now more specifically to the drawings, FIG. 1 is a plan view of part of a semiconductor device 1 embodying the invention. In this example, the semiconductor device 1 may be a vertical power MOSFET or insulated gate bipolar transistor (IGBT). As commonly used in the art and as used herein the term 'vertical' means that the main current path is between the two opposed major surfaces of the semiconductor body 2 within which the device 1 is formed.

Figure 2:
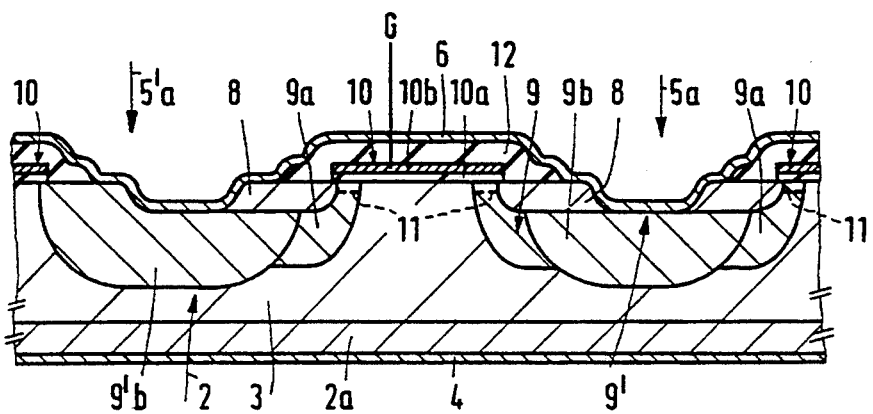
FIG. 2 is a cross-sectional view through part of a semiconductor body illustrating one example of active device cells for a semiconductor device in accordance with the invention.

FIG. 2 illustrates a cross-sectional view through part of the semiconductor body 2 to show a typical example of an active device cell 5a structure which may be used in a semiconductor device in accordance with the invention. The cross-section of FIG. 2 is through a part of the semiconductor adjacent its periphery and so shows a normal active device cell 5a and a peripheral device cell 5a'.

The semiconductor body 2 comprises a relatively highly doped monocrystalline, generally silicon, substrate 2a on which the first region 3 is provided as a relatively lowly doped epitaxial layer. Where the device 1 is a MOSFET then the substrate 2a and epitaxial layer 3 will together form the drain region and will be of the same conductivity type, n conductivity type in this example. Where the device 1 is an IGBT then the substrate 2a will form the anode region and be of the opposite conductivity type, p conductivity type in this example. Although not shown, in the case of an IGBT structure, discrete regions of the one conductivity type, n conductivity type in this example, may extend through the substrate 2a to provide an anode-shorted structure. The first main electrode 4 is provided in ohmic contact with the substrate 2a.

In this example, the device 1 is of the DMOS type with each active device cell 5a comprising a respective second region 8 of the one conductivity type formed in the first region 3 and separated from the first region by an associated conduction channel region-defining third or body region 9 of the opposite conductivity type. The second and third regions 8 and 9 are auto-aligned to an insulated gate structure 10 in known manner so that a conduction channel region 11 of each third region underlies a respective part of the insulated gate structure 10. Generally the insulated gate structure 10 comprises a thermal oxide layer 10a on which is provided a doped polycrystalline silicon layer 10b.

In the example illustrated in FIG. 2, each third region 9 has a relatively highly doped relatively deep subsidiary region 9b formed by use of an appropriate mask before definition of the insulated gate structure 10. Although not shown, each third region may also have a further relatively highly doped subsidiary region which is formed by introduction of impurities after definition of the insulated gate structure 10 but while the photosensitive resist mask (not shown) used to define the insulated gate structure 10 is still in place so that the further relatively highly doped subsidiary region is aligned to the mask but slightly spaced from the edge of the insulated gate structure 10 due to underetching during definition of the insulated gate structure 10.

Each third region 9 has a relatively lowly doped subsidiary region 9a which, like the second region 8, is formed by introduction of impurities after definition of the insulated gate structure 10 so as to be aligned to the insulated gate structure 10. The example illustrated in FIG. 2 has the advantage of effectively automatically aligning the relatively highly doped subsidiary region 9a.

The peripheral device cells 5a' are similar to the remaining active device cells 5a except that the further regions 15 are omitted (or overdoped) from the outer part of the cell and the outer periphery of the cell is formed by a relatively deep relatively highly doped p conductivity region 9b'.

An insulating layer 12 is provided over the insulated gate structure 10 and then windows opened to enable subsequent metallization to provide a gate G electrode (not shown) contacting the insulated gate structure 10 and the second main electrode 6 contacting the second regions 8. The second main electrode 6 also electrically shorts the second regions 8 to the third regions 9. In the examples illustrated this is achieved by etching a moat, using conventional photolithographic and etching processes, through the centers of the second regions 8 to expose a central area 9' of the third regions 9.

In the plan view shown in FIG. 1, the second main electrode 6 (source or cathode metallization) together with the insulating layer 12 is omitted in the interests of clarity. The edge 6a of the second main electrode 6 is however illustrated in dashed lines.

As can clearly be seen from FIG. 1, the device 1 has many (typically hundreds of thousands) of active device cells 5a (surrounded by peripheral active device cells 5a') which are connected in parallel by means of the first and second main electrodes 4 and 6 and the insulated gate structure 10 electrode (not shown).

Although not shown in FIG. 1 generally the outer periphery (as defined by the peripheral device cells 5a') of the semiconductor device will as is well known in the art be surrounded by some form of edge termination, for example field relief (Kao's) rings and/or field plates.

The metallization to form the second main electrode 6 is patterned in such a manner that a number (one or more, typically five to ten cells) of the active device cells 5b are isolated from the second main electrode 6. Instead, these cells 5b are connected to a separate electrode 7 defined from the same metallization (see FIG. 3). The periphery 7a of the separate electrode 7 is illustrated by dashed lines in FIG. 1.

As indicated above and as discussed in detail in, for example, U.S. Pat. No. 4,783,690, those cells 5b and their associated separate electrode 7 form a current emulation or monitor section and the current through these cells is a known fraction (determined by the ratio of the number of active device cells 5a to the number of monitor cells 5b) of the total current through the device 1.

In accordance with the invention the monitor cells 5b are formed so as to be different from the majority of the active device cells 5a and in particular so as to be more susceptible to failure.

This can be achieved in a number of different ways. For example, the monitor cells 5b can be made more susceptible to failure by placing them at the extreme periphery of the active device area. In such a case, the monitor cells 5b may be made more susceptible to failure by forming them in the same manner as the normal active device cells 5a rather than as peripheral device cells 5a', that is by omitting the relatively highly doped guard ring region 9b' from the monitor cells 5b so that each monitor cell 5b has an outer periphery which terminates on a conduction channel-defining subsidiary region 9a.

Figure 3:
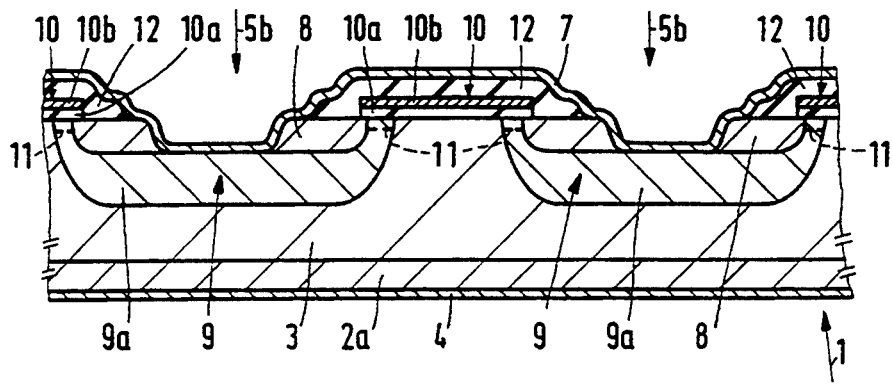
FIG. 3 is a cross-sectional view through part of a semiconductor body illustrating one example of two parallel-connected monitor cells for a semiconductor device in accordance with the invention.
Figure 4:
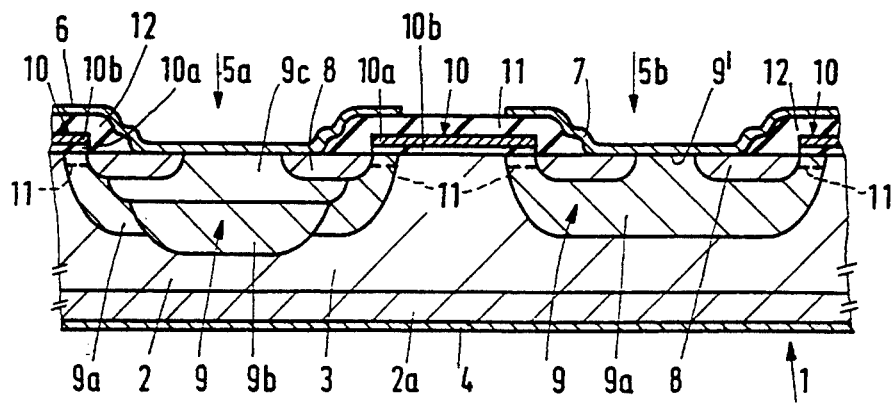
FIG. 4 is a cross-sectional view through part of a semiconductor body illustrating another example of an active device cell and a monitor cell for a semiconductor device in accordance with the invention.

FIGS. 3 and 4 illustrate further ways in which the monitor cells 5b may be made more susceptible to failure.

Thus, FIG. 3 shows two monitor cells 5b from which the relatively highly doped subsidiary region 9b has been omitted. This makes the path in the third region 9 under the second region 8 more resistive and thus makes the cells 5b more likely to breakdown by means of parasitic bipolar action.

FIG. 4 illustrates, for the purposes of comparison, one active device cell 5a and one monitor cell 5b. The active device cell 5a and monitor cell 5b have a structure similar to those shown in FIGS. 2 and 3, respectively, except that, in this case, the short between the second and third regions 8 and 9 is formed by masking the central area of each cell from the impurities introduced to form the second region 8. Also, in this case, the relatively highly doped subsidiary region 9c is shown for the active device cell 5a but is of course omitted from the monitor cell 5b.

In addition the third regions 9 of the monitor cells 5b are shorted to the associated second regions 8 in a manner similar to the normal cells 5a but so that the area 9' of the third regions 9 exposed to form the short is smaller. This means that the distance charge carriers have to travel under the second region 8 to reach the metallization is increased thereby increasing the susceptibility of the monitor cells to breakdown via parasitic bipolar action because it enhances the likelihood of the 0.7 V potential drop across the pn junction between the second and third regions 8 and 9 necessary to cause emission of, in this case, electrons from the second 8 into the third region 9 to initiate bipolar action.

If desired the short could be omitted completely from the monitor cells 5b but that might make them too susceptible to parasitic bipolar action.

Figure 5:
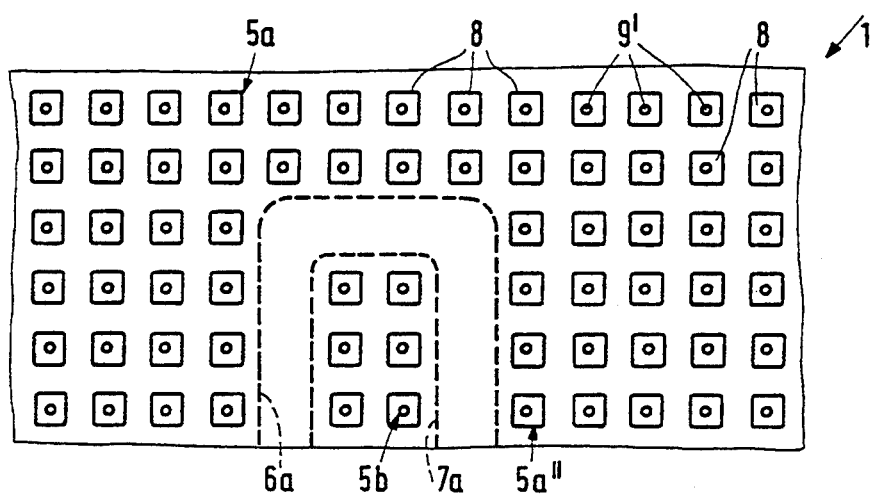
FIG. 5 is a schematic plan view of part of another example of a semiconductor device in accordance with the invention.

FIG. 5 is a plan view similar to FIG. 1 for illustrating another way in which the monitor cells 5b may be made more susceptible to failure. In this case, the monitor cells 5b (which may number say 5–10 cells) are spaced from the regular array of active device cells 5a by omitting the active device cells 5a which would have otherwise been adjacent the monitor cells 5b.

As shown in FIG. 5, the monitor cells 5b are arranged in a two dimensional regular array so as also to be separated from one another by a distance greater than the separation of the active derive cells 5a. The regular array of monitor cells 5b may, however, be a single line os any other appropriate arrangement. A linear arrangement or any other arrangement which increases the ratio between the periphery of the monitor cell arrangement and its area is desirable because it should increase the susceptibility to failure. The regular array of monitor cells 5b may be positioned extending outwardly from the periphery of the semiconductor device 1, as in the example shown in FIG. 1, or may be located within the active area occupied by the device cells 5a. The omission of the active device cells 5a which would have bounded the monitor cell 5b arrangement (and, if present, the greater separation of the monitor cells 5b from one another) means that the parasitic JFET which exists between adjacent cells will pinch off for the remainder of the active device area before it does so for the monitor cell 5b arrangement so that the current through the monitor cell arrangement will continue to increase, thus making the monitor cells more susceptible to failure, once the current path for the remaining active device cells 5a has been pinched off by the action of the parasitic JFET.

It will be appreciated that current flowing through the peripheral channel regions of the active device cells 5a" which surround the monitor cell 5b will similarly not be pinched off with the current flow through the remaining active device cells 5a. These active device cells 5a" could be included in the monitor cell arrangement or could be provided with a peripheral guard ring 9b'.

The monitor cells 5b may be made more susceptible to failure by other geometrical changes, for example by increasing the size of the monitor cells 5b relative to that of the active device cells 5a so that charge carriers have to travel further through the third region 9 to reach the central area 9' where the electrode 7 shorts the second and third regions 8 and 9.

As another possibility the cell shape, that is the shape as defined by the third region 9 may be altered, for example may be more highly curved, to provide areas which will in operation be subject to higher electric fields and thus more liable to breakdown.

Figure 6:
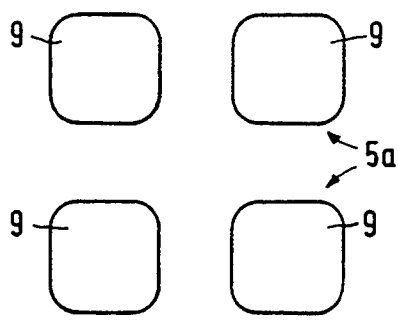
FIGS. 6 and 7 are schematic plan views of cell geometries for active device cells and monitor cells, respectively.
Figure 7:
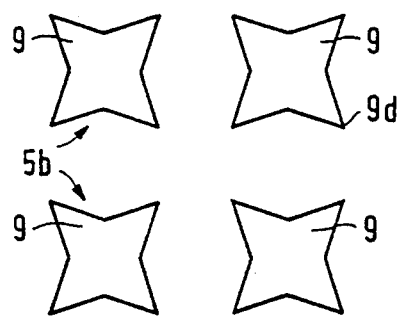

FIGS. 6 and 7 illustrate, in plan view, cell shapes for active device cells 5a and monitor cells 5b, respectively. In this example the active device cells 5a have a square (with rounded corners) geometry. In contrast, the shape of the monitor cells 5b has been distorted to form a pin cushion or four-pointed star shape thereby making the corners 9d more highly curved and so therefore more liable to be subjected to high electric field stress in operation of the device. Of course the active device cells 5a may have other geometries, for example circular or hexagonal and the monitor cells 5b may again have distorted (or completely different) shapes making them more susceptible to breakdown. These changes in geometry can, as will be appreciated by those skilled in the art, be achieved by simple mask modifications.

The monitor cells 5b may be made susceptible to parasitic bipolar action by means of any one or all of the above-mentioned means.

Figure 8:
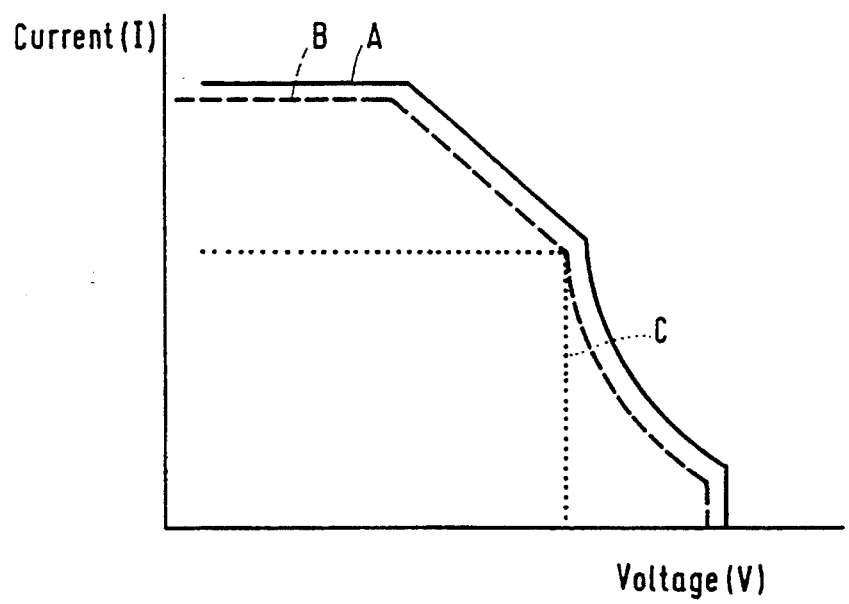
FIG. 8 is a graph of current versus voltage for illustrating the safe operating area (SO of a device in accordance with the invention.

FIG. 8 is a graph of current I against voltage V showing as a solid line A the limit of the safe operating area (SOA) for the majority of the active device cells 5a and as a dashed line B the SOA for the monitor cells 5b. The dotted line C highlights the fact that breakdown of the weak or monitor cells 5b will occur at lower currents and voltages than the breakdown of the active device cells 5a. As can be seen from FIG. 8, the curve B closely follows or tracks the curve A so that it is possible for the device to operate safely up to limits close to its SOA curve A over a wide range of currents and voltages. This is an advantage over the use of external current and voltage limiting arrangements where it is not possible to follow closely the SOA curve, often it can only be approximated to a rectangle, and which therefore require very conservative estimates of the safe operating parameters.

Experiments have been performed on sample devices in which the monitor cells 5b were formed simply by omitting the relatively highly doped subsidiary regions 9b (and 9c if present in the active device cells 5a). The devices were measured under 300 V clamped inductive turn-off conditions using a 47 ohm resistor to determine the current through the monitor cell(s) 5b.

Figure 9A:
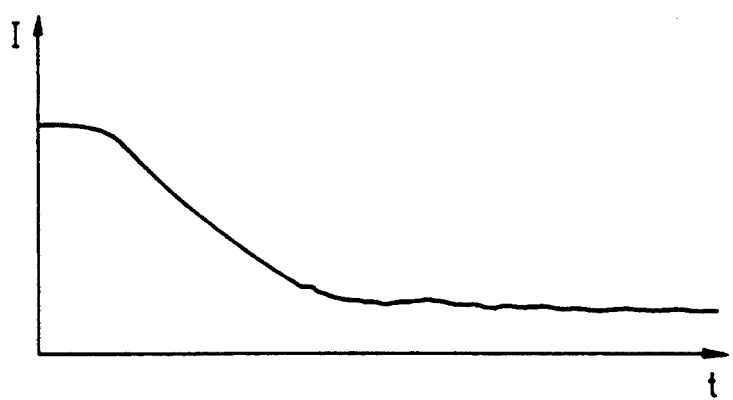
FIGS. 9a and 9b graphs of current I against time t for illustrating the operation of monitor device cells and active device cells of a semiconductor device in accordance with the invention.
Figure 9B:
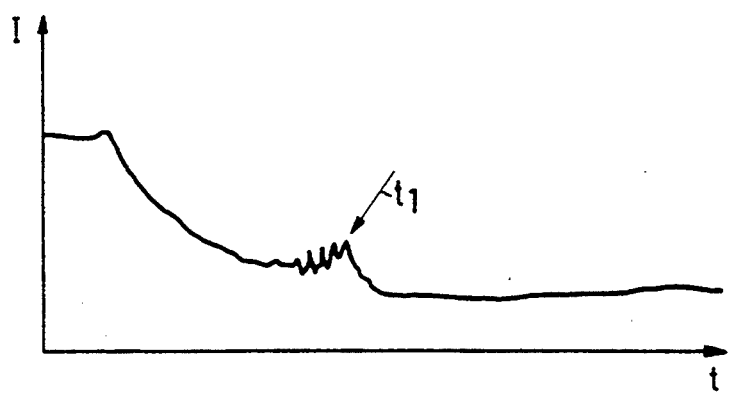

FIGS. 9A and 9B illustrate the change in the current I with time t through the main device formed by the active device cells 5a and through the monitor cell(s) 5b, respectively, for a case where the overall device was close to its safe operating area limit and thus close to failure. It can be seen from FIG. 9B that at time $t_1$ the monitor cell 5b arrangement was close to failure and that the current began to rise but then recovered. Thus, the experimental results show that a detectable difference in current flow through the monitor cell 5b arrangement can be achieved enabling detection (and thus facilitating prevention) of imminent overall device failure without destructive breakdown of the monitor cell 5b arrangement.

Figure 10:
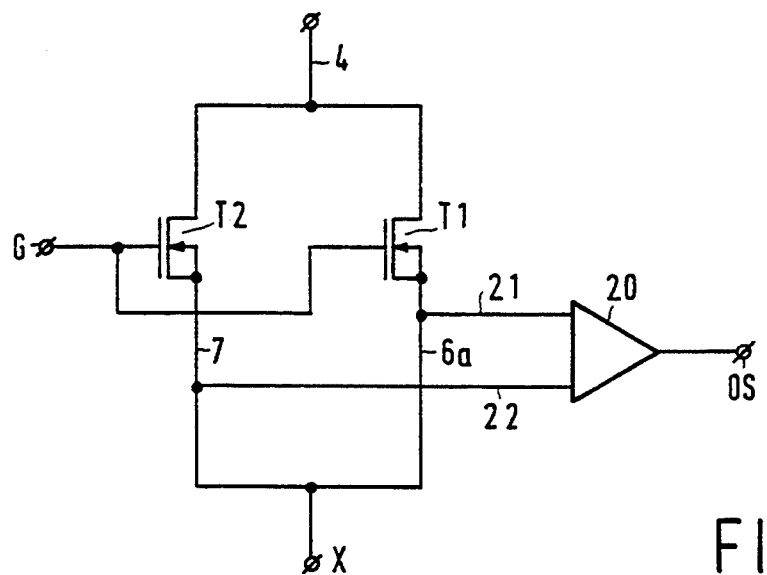
FIG. 10 is a circuit diagram illustrating one way in which the current through the at least one monitor cell may be used to inhibit device failure.

FIG. 10 illustrates one example of a way in which a semiconductor device in accordance with the invention may be used to detect imminent failure of the device. In this example the voltage across (and thus the current through) the monitor cell arrangement 5b which is represented by an IGFET T1 is compared with the voltage across a conventional sense cell arrangement, which is represented by an IGFET T2, by means of a comparator 20 which may be of any suitable form and may be integrated in the same semiconductor body as or formed separately from the semiconductor device 1.

The first electrode of the semiconductor device (not shown in FIG. 10) and the monitor electrode are identified in FIG. 10 by the reference numerals 4 and 7 used in FIGS. 1 to 5 while the sense cell electrode is represented by reference numeral 6a and the common gate electrode of the semiconductor device, monitor cell 5b arrangement and sense cell arrangement S is represented by the letter G. The monitor and sense cell electrodes 7 and 6a are connected to a common reference potential X.

The sense cell arrangement S is formed by a number of the active device cells 5a by appropriately patterning the metallization forming the electrode 6 so as to define the separate electrode 6a. Such a sense cell arrangement S is indicated in FIG. 1 with the boundary 6a' of the sense cell arrangement electrode being shown in dashed lines.

The sense cell arrangement S has the same number of cells as the monitor cell arrangement so that under normal conditions they carry the same current. Thus, when the device 1 is operating normally the voltages across the IGFETs T1 and T2 will be the same. However if the monitor cells 5b begin to fail, the current through them begins to increase causing the comparator 20 to provide a difference signal. This difference signal may be supplied to any appropriate circuitry to control operation of the power device. For example the comparator 20 may, upon detection of a difference signal, provide a high output signal OS to render conducting a transistor which pulls the gate voltage of the active device 1 down towards the source (anode) voltage X.

Whether it is desired to switch the power device on or off will depend upon the reasons for the increase in current. For example if a short circuit is occurring then it is likely that the appropriate action is to switch the power device off while if the current has arisen because of a high voltage rise at the first electrode 4 due to the switching of an inductive load then the remedial action required is to switch the power device on to dissipate the excessive energy. Of course if the power device is already fully on or fully off then the appropriate action would generally be for the control signal to reverse this situation or to alter the gate voltage so as to move the state of the power device towards the opposite situation, that is on if the device is currently off and vice versa. A feedback arrangement could be used so that after the drive signal to the power device has been altered the current through the weak cells is again compared with that through the sense cells to see if the required reduction in current is occurring and if it is not an appropriate control signal supplied either to reverse the previous control signal or to increase the previous control signal depending upon whether or not the detected change was in the right direction.

More practically, a semiconductor device in accordance with the invention could be used either to provide a control signal to switch off the power device when the monitor cell 5b current increases or to provide a control signal to switch on the power device when monitor cell 5b current increases. The former type of device would be used in those situations where a short-circuit is the most likely failure mode while the latter would be used where a highly inductive load was being switched. In each case, conventional protection against the other failure mode (i.e inductive switching and short-circuit protection, respectively) could be provided separately.

Figure 11:
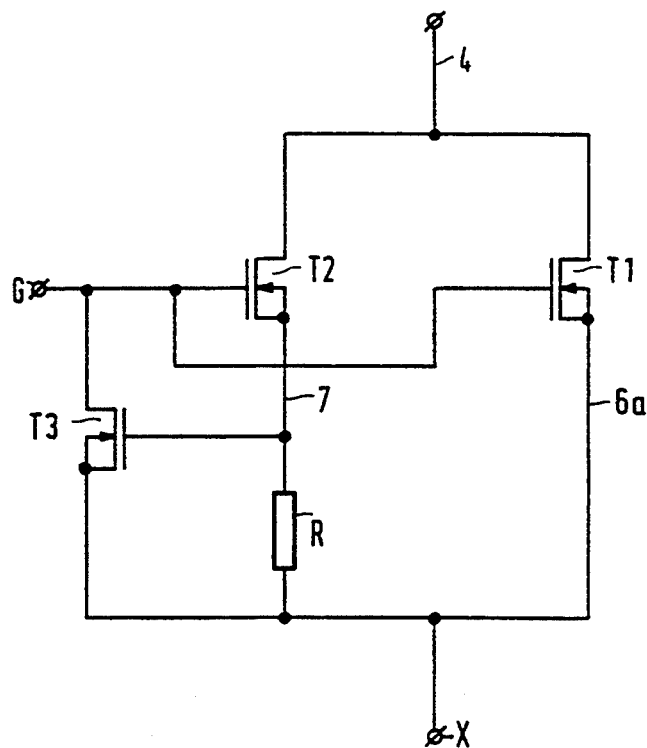
FIG. 11 is a circuit diagram illustrating another way in which the current through the at least one monitor cell may be used to inhibit device failure.

FIG. 11 illustrates schematically an alternative arrangement. In this example a resistor R is connected in series with the monitor electrode 7 between the monitor electrode 7 and the reference potential X. The monitor electrode 7 is also connected to the control electrode of a transistor T3. In this example the transistor T3 is an IGFET although it could be a bipolar transistor. The main current path of the transistor T3 is connected between the gate electrode G and the reference potential X.

The transistor T3 and resistor R may be diffused devices formed in an isolation well within the semiconductor body g. As an alternative, the transistor T3 and resistor R3 may be thin-film devices formed on top of an insulated from the semiconductor body 2. Of course, separate discrete components could be used.

In the arrangement shown in FIG. 11, when the monitor cells 5b begin to fail and thus the current through these cells 5b rises the voltage across the resistor R will increase until the threshold voltage of the transistor T3 is reached when the transistor T3 begins to conduct so pulling down the gate voltage of the device 1 so as to reduce the current through the device 1.

There should be sufficient time from detection of the onset of failure of the monitor cells to take action to protect the device 1, for example by switching it off or reducing the gate voltage drive to limit the current in the manner described above, so as to prevent irreversible failure of the monitor cells 5b. Even if this is not the case, there will be sufficient time to prevent failure of the active device cells 5a so that although the monitor cells 5b may fail the device will still be functional. Of course, in this latter situation the device 1 will only be protected for the first occassion on which the current rises excessively (for example due to a short circuit).

It will of course be appreciated that the present invention could be applied to cellular semiconductor devices other than IGBTs and power MOSFETs, for example cellular power bipolar transistors, and that it may be applied to lateral in addition to vertical current flow devices. Semiconductor materials others than silicon may be used.

From reading the present disclosure, other modifications and variations will be apparent to persons skilled in the art. Such modifications and variations may involve other features which are already known in the semiconductor art and which may be used instead of or in addition to features already described herein.

I claim:

1. A semiconductor device comprising a semiconductor body having a first region providing a current path to a first main electrode and comprising a plurality of active device cells, a majority of said active device cells being connected to a second main electrode for providing a main current path through the device between the first and second main electrodes and at least one remaining active device cell forming a monitor cell and being connected to a monitor electrode for providing a monitor current path through the device between the first main electrode and the monitor electrode, characterized in that the at least one monitor cell is structurally formed differently from the majority of the active device cells so as to comprise means for being more susceptible to failure than the majority of the active device cells.

2. A device according to claim 1, wherein means are provided for comparing the currents along the main current path and the monitor current path to enable the onset of failure of the at least one monitor cell to be detected.

3. A device according to claim 1, having a circuit configuration wherein a monitor resistor is provided in series with the monitor electrode and means responsive to a voltage across the monitor resistor are provided for reducing a drive voltage to a control electrode of the active device when a current through the at least one monitor cell exceeds a given value.

4. A device according to claim 1, wherein each active device cell comprises an insulated gate field effect device cell having an insulated gate overlying a conduction channel region between a second region and the first region, the second main electrode being connected to the second regions of the majority of the device cells, the monitor electrode being connected to the second region of the at least one monitor cell, and an insulated gate electrode being connected to the insulated gates for controlling the conduction channel regions between the first and second regions, the at least one monitor cell being structurally formed so as to be more susceptible to failure by parasitic bipolar action than the majority of the active device cells.

5. A device according to claim 4, wherein the first and second regions are of the same conductivity type and each second region is separated from the first region by a respective body region of the opposite conductivity type which defines with the insulated gate the conduction channel region between the first and second regions.

6. A device according to claim 5, wherein the body region of each of the majority of the active device cells has a relatively highly doped subsidiary region for inhibiting parasitic bipolar action but the relatively highly doped subsidiary region is omitted from the at least one monitor device cell.

7. A device according to claim 5, wherein a predetermined surface area of the body region of each of the majority of the active device cells is electrically shorted to its second region and a given surface area, smaller than the predetermined area, of the body region of the at least one monitor cell is electrically shorted to its second region.

8. A device according to claim 5, wherein a body region of the at least one monitor cell has corners having a higher degree of curvature than corners of the active device cells.

9. A device according to claim 1, wherein the at least one monitor cell has a different geometry from the active device cells.

10. A device according to claim 1, wherein the active device cells define an active device area which is bounded by peripheral active device cells with each peripheral active device cell having an integral guard region for inhibiting breakdown of the peripheral active device cell and wherein the at least one monitor cell is provided at the periphery of the active device area but is not provided with an integral guard region.

11. A device according to claim 1, wherein the active device cells form a first regular array and a number of monitor cells are provided which form a second regular array and the second regular array is separated from the first regular array by a distance greater than the separation of the active device cells in the first regular array.

12. A device according to claim 11, wherein the monitor cells in the second regular array are separated from one another by a distance greater than the separation of the active device cells in the first regular array.

13. A semiconductor device according to claim 1, wherein the first region forms a pn junction with at least one further region of the opposite conductivity type for injecting minority carriers into the first region.

* * * * *